(12) United States Patent
Kürten et al.

(10) Patent No.: US 12,136,603 B2
(45) Date of Patent: Nov. 5, 2024

(54) SEMICONDUCTOR ARRANGEMENT COMPRISING A SEMICONDUCTOR ELEMENT, A SUBSTRATE AND BOND CONNECTING MEANS

(71) Applicant: Siemens Aktiengesellschaft, Munich (DE)

(72) Inventors: Bernd Kürten, Obermichelbach (DE); Felix Zeyss, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/579,130

(22) PCT Filed: Jun. 13, 2022

(86) PCT No.: PCT/EP2022/065945
§ 371 (c)(1),
(2) Date: Jan. 12, 2024

(87) PCT Pub. No.: WO2023/285046
PCT Pub. Date: Jan. 19, 2023

(65) Prior Publication Data
US 2024/0266312 A1 Aug. 8, 2024

(30) Foreign Application Priority Data

Jul. 13, 2021 (EP) ..................................... 21185247

(51) Int. Cl.
*H01L 23/00* (2006.01)
(52) U.S. Cl.
CPC .............. *H01L 24/45* (2013.01); *H01L 24/43* (2013.01); *H01L 24/46* (2013.01);
(Continued)

(58) Field of Classification Search
CPC .......... H01L 24/45; H01L 24/43; H01L 24/46
See application file for complete search history.

(56) References Cited

U.S. PATENT DOCUMENTS

2004/0217488 A1 11/2004 Luechinger
2007/0182026 A1 8/2007 Nishiura
(Continued)

FOREIGN PATENT DOCUMENTS

DE 112004000727 B4 4/2018
DE 102019200634 A1 8/2019
(Continued)

OTHER PUBLICATIONS

PCT International Search Report and Written Opinion of International Searching Authority mailed Jun. 2, 2023 corresponding to PCT International Application No. PCT/EP2022/065945 filed Jun. 13, 2022.

*Primary Examiner* — Marc Anthony Armand
(74) *Attorney, Agent, or Firm* — Henry M. Feiereisen LLC (57) ABSTRACT

A semiconductor arrangement includes a substrate, a semiconductor element connected to the substrate and including on a side remote from the substrate a contact surface which is connected to the substrate via a first bond connecting means such that as to form on the contact surface a stitch contact arranged between a first loop and a second loop of the first bond connecting means. The first loop has a first maximum and the second loop has a second maximum. A second bond connecting means has a first transverse arranged to run above the first stitch contact and, viewed running parallel to the contact surface, between the first maximum of the first loop and the second maximum of the second loop. The first transverse loop of the second bond connecting means is arranged to run below the first maximum of the first loop and/or the second maximum of the second loop.

20 Claims, 5 Drawing Sheets

(52) U.S. Cl.
CPC ............... *H01L 2224/46* (2013.01); *H01L 2224/48091* (2013.01); *H01L 2224/48101* (2013.01)

(56) References Cited

U.S. PATENT DOCUMENTS

| | | | |
|---|---|---|---|
| 2018/0240771 A1* | 8/2018 | Nakajima | ............ H01L 24/48 |
| 2019/0157237 A1* | 5/2019 | Lee | ............ H01L 24/85 |
| 2020/0395344 A1 | 12/2020 | Horie et al. | |

FOREIGN PATENT DOCUMENTS

| | | |
|---|---|---|
| DE | 112019000660 T5 | 10/2020 |
| DE | 102019114520 A1 | 12/2020 |
| JP | S52152678 U | 11/1977 |

* cited by examiner

SEMICONDUCTOR ARRANGEMENT COMPRISING A SEMICONDUCTOR ELEMENT, A SUBSTRATE AND BOND CONNECTING MEANS

CROSS-REFERENCES TO RELATED APPLICATIONS

This application is the U.S. National Stage of International Application No. PCT/EP2022/065945, filed Jun. 13, 2022, which designated the United States and has been published as International Publication No. WO 2023/285046 A2 and which claims the priority of European Patent Application, Serial No. 21185247.0, filed Jul. 13, 2021, pursuant to 35 U.S.C. 119(a)-(d).

BACKGROUND OF THE INVENTION

The invention relates to a semiconductor arrangement with a semiconductor element, a substrate and bond connecting means.

In addition, the invention relates to a semiconductor module with at least one semiconductor arrangement of this kind.

Furthermore, the invention relates to a power converter with at least one semiconductor module of this kind.

The invention relates, moreover, to a method for producing a semiconductor arrangement with a semiconductor element, a substrate and bond connecting means.

As a rule, a semiconductor module of this kind is used in a power converter. A power converter should be taken to mean, for example, a rectifier, an inverter, a converter or a DC converter. The semiconductor elements used in the semiconductor module are, inter alia, transistors, triacs, thyristors or diodes. Transistors are designed, for example, as Insulated-Gate Bipolar Transistors (IGBTs), field effect transistors or bipolar transistors. The semiconductor elements of a semiconductor arrangement are conventionally connected via bond connecting means on a substrate. Bond connecting means of this kind can be designed, inter alia, as bond wires and/or bond ribbons. In particular, power contacts of a semiconductor element, inter alia an emitter contact of an IGBT, are conventionally connected with a plurality of bond connecting means on the substrate.

Patent specification DE 11 2004 000 727 B4 describes an electronic subassembly comprising an electronic apparatus with a conductive upper surface, a conductive terminal external to the electronic apparatus and a conductive ribbon, which is ultrasonically bonded to a first portion of the conductive upper surface and is bonded to the conductive terminal, wherein the conductive ribbon comprises a first layer, which connects the conductive upper surface, and a second layer, which lies above the first layer, wherein the first layer is made from aluminum and the second layer from copper.

As a rule, it is advantageous to position the semiconductor elements of the semiconductor arrangement in a semiconductor module as far apart from each other as possible to achieve, for example, optimum heat dissipation by heat spreading. In order to nevertheless keep the dimensions of the semiconductor module as low as possible, additional installation space is to be minimized for the wiring, for example for connecting control contacts, inter alia, a gate contact of an IGBT. Difficulties arise with the wiring inside the semiconductor module, in particular, if semiconductor elements are positioned close to a module edge where terminal pins of a housing are conventionally located, which are likewise interconnected internally in the module via bond connecting means. Long bonding wires and associated high ribbon inductances, inter alia, have an adverse effect on the electrical performance of the circuit, in particular in the case of the control contacts.

Published unexamined patent application DE 11 2019 000 660 T5 describes substrates, which have a main surface, a plurality of conductor patterns, which are provided on the main surface, a plurality of switching elements, which are arranged on the plurality of conductor patterns in order to connect collector electrodes, and a single or a plurality of wiring element(s), which directly connect emitter electrodes of the wiring elements which are arranged on different conductor patterns and are connected in parallel between the plurality of switching elements.

Against this background, the object underlying the invention is to disclose a semiconductor arrangement which, compared to the prior art, has improved wiring.

SUMMARY OF THE INVENTION

The object is inventively achieved by a semiconductor arrangement with a semiconductor element, a substrate and bond connecting means, wherein the semiconductor element is connected, in particular integrally bonded, to the substrate, wherein on a side remote from the substrate, the semiconductor element has at least one contact surface, wherein at least one contact surface of the semiconductor element is connected to the substrate via at least one first bond connecting means, wherein on the contact surface, the at least one first bond connecting means forms at least one first stitch contact respectively, which is arranged between a first loop and a second loop of the respective first bond connecting means, wherein the first loop has a first maximum and the second loop has a second maximum, wherein a first transverse loop of a second bond connecting means is arranged to run above the first stitch contact and, viewed running parallel to the contact surface, between the first maximum of the first loop and the second maximum of the second loop.

In addition, the object is inventively achieved by a semiconductor module with at least one semiconductor arrangement of this kind.

The object is inventively achieved, moreover, by a power converter with at least one semiconductor module of this kind.

Furthermore, the object is inventively achieved by a method for producing a semiconductor arrangement with a semiconductor element, a substrate and bond connecting means, wherein the semiconductor element is connected, in particular integrally bonded, to the substrate, wherein on a side remote from the substrate, the semiconductor element has at least one contact surface, wherein at least one contact surface of the semiconductor element is connected to the substrate via at least one first bond connecting means, wherein on the contact surface, the at least one first bond connecting means forms at least one first stitch contact respectively, which is arranged between a first loop and a second loop of the respective first bond connecting means, wherein the first loop has a first maximum and the second loop has a second maximum, wherein in a further step, a first transverse loop of a second bond connecting means is arranged to run above the first stitch contact and, viewed running parallel to the contact surface, between the first maximum of the first loop and the second maximum of the second loop.

The advantages and preferred embodiments mentioned below in relation to the semiconductor arrangement may be analogously transferred to the semiconductor module, the power converter and the method.

The invention is based on the consideration of disclosing compact wiring of a semiconductor arrangement to achieve optimum heat dissipation and electrical performance. In a semiconductor arrangement of this kind, at least one semiconductor element is connected, in particular integrally bonded, to a substrate, wherein the semiconductor element is designed, for example, as an Insulated-Gate Bipolar Transistor (IGBT), wherein an integral bond of this kind can be established, for example, via a soldered or sintered joint. At least one contact surface arranged on a side of the semiconductor element remote from the substrate is connected to the substrate via at least one first bond connecting means. The at least one first bond connecting means can be designed, inter alia, as a bonding wire or bonding ribbon. For example, at least one heavy-wire bond, in particular made of aluminum, with a substantially circular cross-section with a diameter in the region of 100 μm to 500 μm is used. The connection to the contact surface of the semiconductor element is established by means of looping through of the at least one first bond connecting means, in particular by means of multi-stitch wedge-to-wedge wire bonding. At least one first stitch contact, which is arranged between a first loop and a second loop of a first bond connecting means is formed by bonding multiple times, which is also called "stitching". Stitch contacts of this kind are conventionally also referred to as "stitch bonds" and can be designed, for example, as "wedge bonds". The first loop has a first maximum, while the second loop has a second maximum. Improved power distribution on a semiconductor element is achieved by way of the "stitching".

A second bond connecting means, which can be designed, inter alia, as bonding wire or bonding ribbon, is used for further wiring, for example for connecting at least one control contact or an auxiliary emitter. A first transverse loop of the second bond connecting means is arranged to run above the first stitch contact and between the first maximum of the first loop and the second maximum of the second loop. A shorter bond inductance is achieved by way of this kind of course of the second bond connecting means via the semiconductor element, and this has a positive effect, inter alia, on the electrical performance of the circuit. In addition, installation space is saved and greater flexibility with the wiring but also with the positioning of the at least one semiconductor element in the semiconductor arrangement is achieved, and this results, inter alia, in optimum heat dissipation, for example by heat spreading.

The first transverse loop of the second bond connecting means is arranged to run, in particular completely, below the first maximum of the first and/or the second maximum of the second loop. The first transverse loop of the second bond connecting means is arranged below the first maximum and/or the second maximum if at least some of the cross-sectional area of the second bond connecting means runs below the first maximum and/or the second maximum when crossing the respective first bond connecting means. The first transverse loop of the second bond connecting means is arranged completely below the first maximum and/or the second maximum if the entire cross-sectional area of the second bond connecting means runs below the first maximum and/or the second maximum when crossing the respective first bond connecting means. The second bond connecting means thus runs through the "bond valley" of the respective first bond connecting means formed by the first stitch contact. A shorter bond inductance is achieved by way of this kind of course of the second bond connecting means via the semiconductor element, and this has a positive effect, inter alia, on the electrical performance of the circuit.

A further embodiment provides that on the side remote from the substrate, the semiconductor element has at least one control contact surface, wherein the second bond connecting means is connected to the control contact surface. This kind of course of the second bond connecting means via the semiconductor element avoids having to arrange the wiring for a control signal to run around the semiconductor element, so a shorter bond inductance is achieved, and this has a positive effect, inter alia, on the switching behavior. In addition, installation space is saved.

One further embodiment provides that a control contact surface of a further semiconductor element is connected to the control contact surface of the semiconductor element via the first transverse loop of the second bond connecting means. Installation space is saved and the length of a bond wire is reduced by this kind of chip-to-chip connection of the wiring for the control signal.

A further embodiment provides that the second bond connecting means is arranged at an angle between 75° and 90°, in particular between 85° and 90°, to the at least one first bond connecting means. A coupling, inter alia between control signal and load current, is minimized by an arrangement of this kind.

A further embodiment provides that, on the contact surface, the at least one first bond connecting means forms a second stitch contact respectively, which is arranged between the first loop and a third loop of the respective first bond connecting means, wherein the third loop has a third maximum, wherein a second transverse loop of a third bond connecting means is arranged to run above the second stitch contact and, viewed running parallel to the contact surface, between the first maximum of the first loop and the third maximum of the third loop. Additional installation space is saved by an arrangement of this kind.

A further embodiment provides that the first transverse loop of the second bond connecting means and the second transverse loop of the third bond connecting means are arranged to run, in particular completely, below the first maximum of the first loop, the second maximum of the second loop and/or the third maximum of the third loop. A shorter bond inductance is achieved by this kind of course of the second bond connecting means via the semiconductor element, and this has a positive effect, inter alia, on the electrical performance of the circuit.

A further embodiment provides that, on the contact surface, a plurality of first bond connecting means arranged to run parallel form at least one first stitch contact respectively, wherein the respective first stitch contacts are arranged between a first loop and a second loop of the respective first bond connecting means, wherein the first loop of the respective first bond connecting means has a first maximum and the second loop of the respective first bond connecting means has a second maximum, wherein the first transverse loop of the second bond connecting means is arranged to run above the first stitch contacts of the first bond connecting means arranged to run parallel and, viewed running parallel to the contact surface, between the respective first maximum of the first loop and the respective second maximum of the second loop. The first stitch contacts form "bond valleys" via which the transverse loop of the second bond connecting means runs. In particular, the first stitch contacts are arranged in such a way that a connection between the first stitch contacts forms a straight line. The straight line can be arranged to run, inter alia, parallel to a chip edge. Alternatively, the first stitch contacts can be arranged mutually offset. An improved current distribution on a semiconductor element is achieved by the use of a plurality of first bond connecting means arranged to run parallel, which are connected to the contact surface multiple times by "stitching" respectively. A shorter bond inductance is achieved by a course of the second bond connecting means via the first stitch contacts of the semiconductor element, and this has a positive effect, inter alia, on the electrical performance of the circuit. In addition, installation space is saved.

A further embodiment provides that the first transverse loop of the second bond connecting means is arranged to run, in particular completely, below the respective first maximum of the first loop and/or the respective second maximum of the second loop. The second bond connecting means thus runs through the "bond valleys" formed by the respective first stitch contacts. A shorter bond inductance is achieved by this kind of course of the second bond connecting means, and this has a positive effect, inter alia, on the electrical performance of the circuit.

BRIEF DESCRIPTION OF THE DRAWING

The invention will be described and explained in more detail below on the basis of the exemplary embodiments represented in the figures.

In the drawings.

DETAILED DESCRIPTION OF PREFERRED EMBODIMENTS

The exemplary embodiments explained below are preferred embodiments of the invention. In the exemplary embodiments, the described components of the embodiments respectively represent individual, features of the invention which are to be considered independently of each other and which develop the invention, also independently of each other respectively and therewith should be regarded, again individually or in a combination other than that shown, as a constituent part of the invention. Furthermore, the described embodiments can also be supplemented by further features of the invention which have already been described.

Identical reference numerals have an identical meaning in the different figures.

Figure 1:
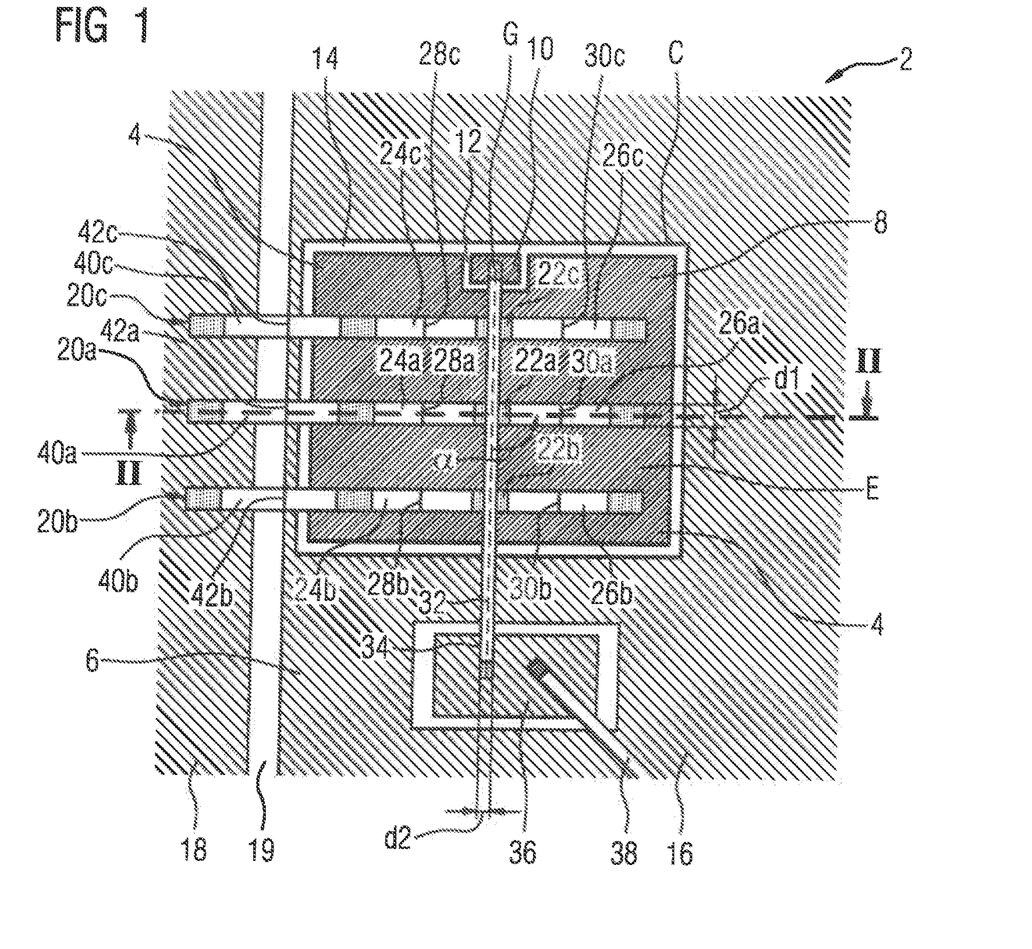
FIG. 1 shows a schematic representation of a first embodiment of a semiconductor arrangement in a plan view.

FIG. 1 shows a schematic representation of a first embodiment of a semiconductor arrangement 2 in a plan view, which comprises a semiconductor element 4, which is connected on a substrate 6. By way of example, the semiconductor element 4 is designed as an Insulated-Gate Bipolar Transistor (IGBT). In addition examples of semiconductor elements 4 of this kind are triacs, thyristors, diodes or other types of transistor, such as field effect transistors. The IGBT comprises a control terminal, which is designed as a gate terminal G, as well as load terminals, which are designed as collector terminal C and emitter terminal E, with the collector terminal C, on a side of the semiconductor element 4 facing the substrate 6, being integrally bonded to the substrate 6.

The emitter terminal E has a contact surface 8, with the gate terminal G having a control contact surface 10. The contact surface 8 and the control contact surface 10 have at least one metal layer, which contains, for example, aluminum, cooper and/or gold. An electrically isolating intermediate layer 12 is arranged between the contact surface 8 of the emitter terminal E and the control contact surface 10 of the gate terminal G. In addition, the semiconductor element 4 has an electrically insulating guard ring 14. The electrically insulating intermediate layer 12 and the electrically insulating guard ring 14 are made from a dielectric material, in particular polyimide or aluminum oxide.

The IGBT is connected to a first conductor path 16 of the substrate 6, for example via a soldered or sintered joint. In addition, the substrate 6 has a second conductor path 18 arranged in an isolated manner from first conductor path 16.

Furthermore, the substrate 6 comprises a dielectric material layer 19, which contains, for example, a ceramic material, in particular aluminum nitride or aluminum oxide, and has a thickness d of 25 µm to 400 µm, in particular 50 µm to 250 µm. The second conductor path 18 is connected to the contact surface 8 of the emitter terminal E via, by way of example, three first bond connecting means 20a, 20b, 20c, which are arranged to run substantially parallel. The first bond connecting means 20a, 20b, 20c can be designed as bond wires and/or bond ribbons. In particular, heavy-wire bonds, for example made of aluminum, with a substantially circular cross-section with a diameter d1 in the range of 100 µm to 500 µm are used.

The connection is established by means of lopped-through bond connecting means 20a, 20b, 20c on the contact surface 8, in particular by means of multi-stitch wedge-to-wedge wire bonding. Improved current distribution on a semiconductor element 4 is achieved by bonding multiple times, which is also called "stitching". The bond connecting means 20a, 20b, 20c form a first stitch contact 22a, 22b, 22c respectively, which are arranged between a first loop 24a, 24b, 24c and a second loop 26a, 26b, 26c respectively of the respective first bond connecting means 20a, 20b, 20c. A connection between the first stitch contacts 22a, 22b, 22c forms a straight line. By way of example, the first stitch contacts 22a, 22b, 22c are arranged parallel to a chip edge. The first loop 24a, 24b, 24c of the respective first bond connecting means 20a, 20b, 20c has a first maximum 28a, 28b, 28c, while the second loop 26a, 26b, 26c of the respective first bond connecting means 20a, 20b, 20c has a second maximum 30a, 30b, 30c.

A first transverse loop 32 of a second bond connecting means 34 is arranged to run above the first stitch contacts 22a, 22b, 22c of the first bond connecting means 20a, 20b, 20c arranged to run parallel and between the respective first maximum 28a, 28b, 28c of the first loop 24a, 24b, 24c and the respective second maximum 30a, 30b, 30c of the second loop 26a, 26b, 26c. In addition, the first transverse loop 32 of the second bond connecting means 34 is arranged to run, in particular completely, below the respective first maximum 28a, 28b, 28c of the first loop 24a, 24b, 24c and the respective second maximum 30a, 30b, 30c of the second loop 26a, 26b, 26c. The second bond connecting means 34 can have, inter alia, a substantially circular cross-section with a diameter d2, which is smaller than the diameter d1 of the first bond connecting means 20a, 20b, 20c. In addition, a connection from a third conductor path 36 to the control terminal of the IGBT is established via the second bond connecting means 34. Furthermore, the second bond connecting means 34 is arranged at substantially a right angle α to the first bond connecting means 20a, 20b, 20c. The third conductor path 36 is connected to an actuation apparatus, for example via a further bond connecting means 38, which apparatus is not represented in FIG. 1 for reasons of clarity. Alternatively, the third conductor path 36 is designed as a terminal pin of a housing. A terminal pin of this kind can be arranged so as to be elevated with respect to the substrate 6.

Between the second conductor path 18 and the contact surface 8 the first bond connecting means 20a, 20b, 20c form a third loop 40a, 40b, 40c respectively. The third loop 40a, 40b, 40c of the respective first bond connecting means 20a, 20b, 20c has a third maximum 42a, 42b, 42c, with the first transverse loop 32 of the second bond connecting means 34 also being arranged to run, in particular completely, below the respective third maximum 42a, 42b, 42c of the third loop 40a, 40b, 40c.

Figure 2:
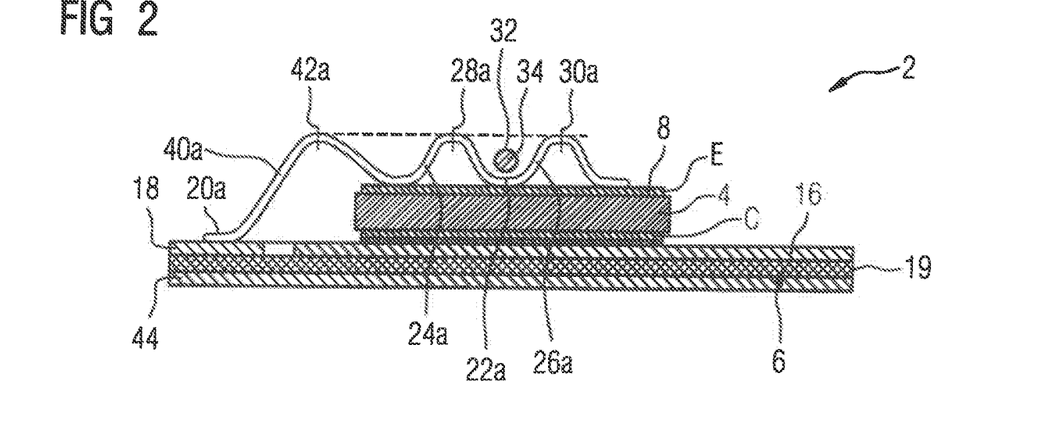
FIG. 2 shows a schematic representation of the first embodiment of the semiconductor arrangement in a cross-section.

FIG. 2 shows a schematic representation of the first embodiment of the semiconductor arrangement 2 in a cross-section. A metallizing 44 is represented in the cross-section.

Figure 3:
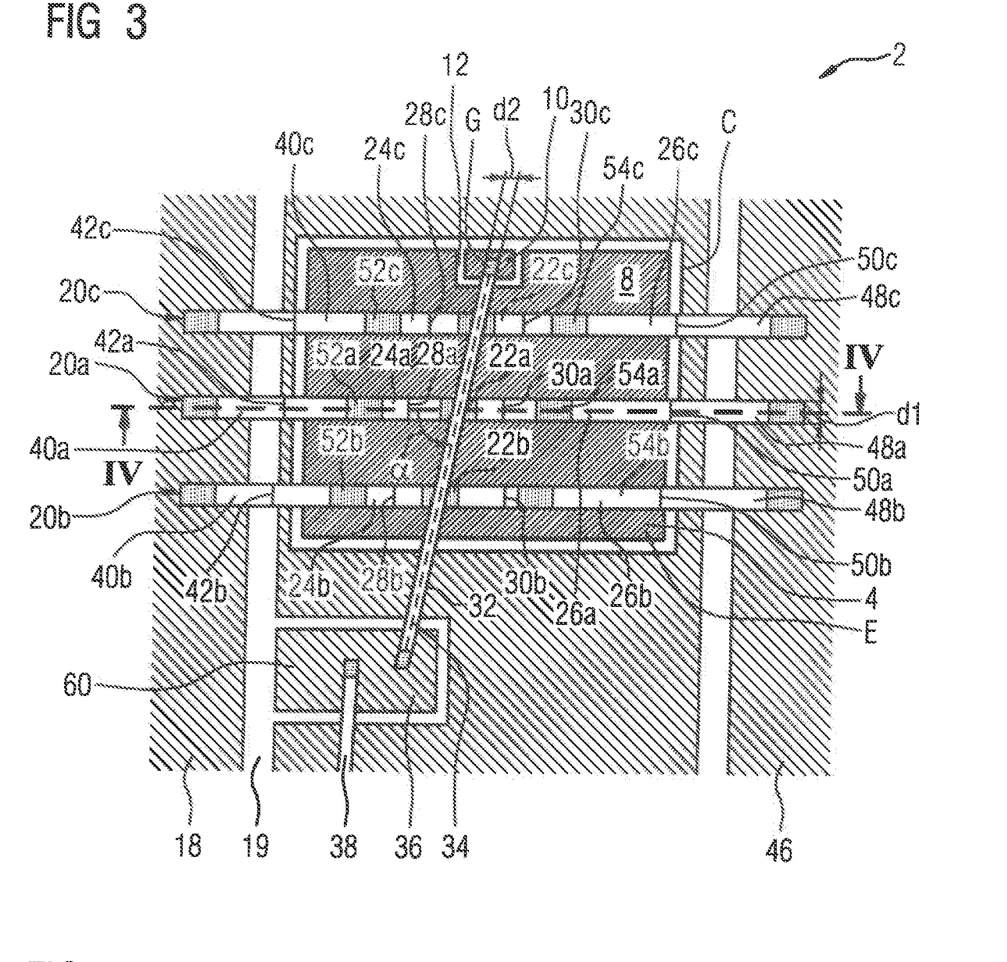
FIG. 3 shows a schematic representation of a second embodiment of a semiconductor arrangement in a plan view.

FIG. 3 shows a schematic representation of a second embodiment of a semiconductor arrangement 2 in a plan view. The, by way of example, three first bond connecting means 20a, 20b, 20c arranged to run substantially parallel establish a connection of the contact surface 8 of the emitter terminal E to the second conductor path 18 and to a fourth conductor path 46, which is arranged so as to be insulated from the first conductor path 16 and from the second conductor path 18. The semiconductor element 4 is thus "over-bonded", that of the second conductor path 18 is connected to the fourth conductor path 46 via the emitter E. Between the fourth conductor path 46 and the contact surface 8 the first bond connecting means 20a, 20b, 20c form a fourth loop 48a, 48b, 48c respectively. The fourth loop 48a, 48b, 48c of the respective first bond connecting means 20a, 20b, 20c has a fourth maximum 50a, 50b, 50c, with the first transverse loop 32 of the second bond connecting means 34 also being arranged to run, in particular completely, below the respective fourth maximum 50a, 50b, 50c of the fourth loop 48a, 48b, 48c.

Furthermore, the second bond connecting means 34 is arranged at an angle α of less than 90°, for example 80°, to the first bond connecting means 20a, 20b, 20c. In order for the first transverse loop 32 to be arranged to run between the respective first maximum 28a, 28b, 28c of the first loop 24a, 24b, 24c and the respective second maximum 30a, 30b, 30c of the second loop 26a, 26b, 26c as well as, in particular completely, below the respective first maximum 28a, 28b, 28c of the first loop 24a, 24b, 24c and the respective second maximum 30a, 30b, 30c of the second loop 26a, 26b, 26c, the first stitch contacts 22a, 22b, 22c are arranged mutually offset. The connection of the third loop 40a, 40b, 40c and of the fourth loop 48a, 48b, 48c of the respective first bond connecting means 20a, 20b, 20c to the contact surface 8 forms second stitch contacts 52a, 52b, 52c and third stitch contacts 54a, 54b, 54c which, analogously to the first stitch contacts 22a, 22b, 22c, are arranged mutually offset, so the first loops 24a, 24b, 24c and the second loops 26a, 26b, 26c have substantially identical geometry respectively. The further design of the semiconductor arrangement 2 in FIG. 3 corresponds to that in FIG. 1.

Figure 4:
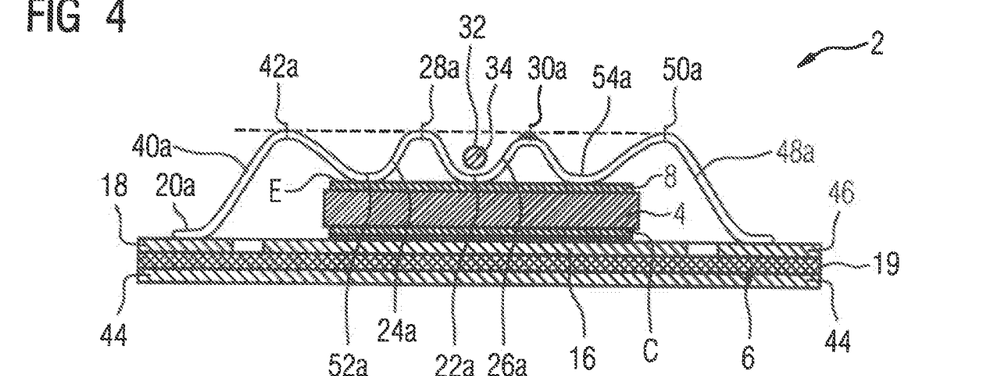
FIG. 4 shows a schematic representation of the second embodiment of the semiconductor arrangement in a cross-section.

FIG. 4 shows a schematic representation of the second embodiment of the semiconductor arrangement 2 in a cross-section.

Figure 5:
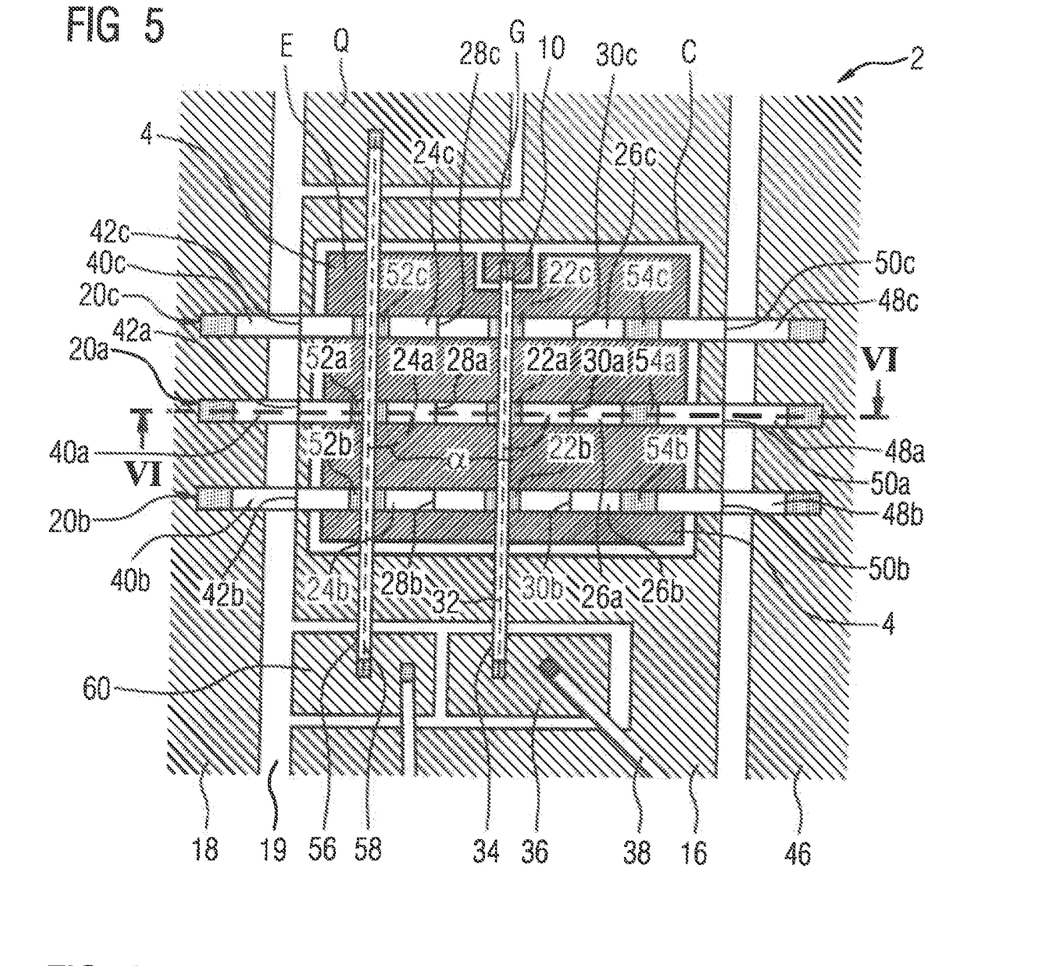
FIG. 5 shows a schematic representation of a third embodiment of a semiconductor arrangement in a plan view.

FIG. 5 shows a schematic representation of a third embodiment of a semiconductor arrangement in a plan view, with a second transverse loop 56 of a third bond connecting means 58 being arranged to run above the second stitch contacts 52a, 52b, 52c of the first bond connecting means 20a, 20b, 20c arranged to run parallel and between the respective third maximum 42a, 42b, 42c of the third loop 40a, 40b, 40c and the respective first maximum 28a, 28b, 28c of the first loop 24a, 24b, 24c. The third bond connecting means 58 connects, by way of example, a fifth conductor path 60 to a sixth conductor path 62, with the third bond connecting means 58 completely spanning the semiconductor element 4 via the second stitch contacts 52a, 52b, 52c. The third bond connecting means 58 can be designed as an auxiliary emitter terminal. The second bond connecting means 34 and the third bond connecting means 58 are arranged to run substantially parallel to each other. Alternatively, the third conductor path 36 and the fifth conductor path 60 are designed as terminal pins of a housing. Terminal pins of this kind can be arranged so as to be elevated with respect to the substrate 6. The further design of the semiconductor arrangement 2 in FIG. 5 corresponds to that in FIG. 1.

Figure 6:
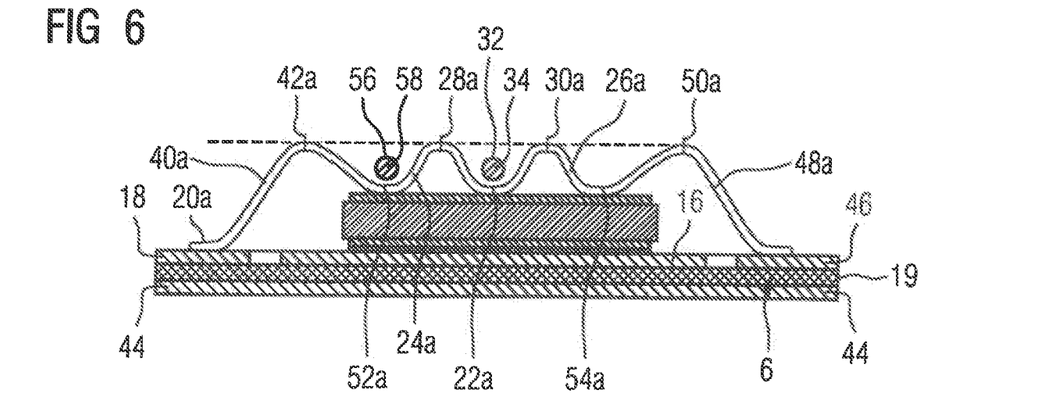
FIG. 6 shows a schematic representation of the third embodiment of the semiconductor arrangement in a cross-section.

FIG. 6 shows a schematic representation of the third embodiment of the semiconductor arrangement in a cross-section.

Figure 7:
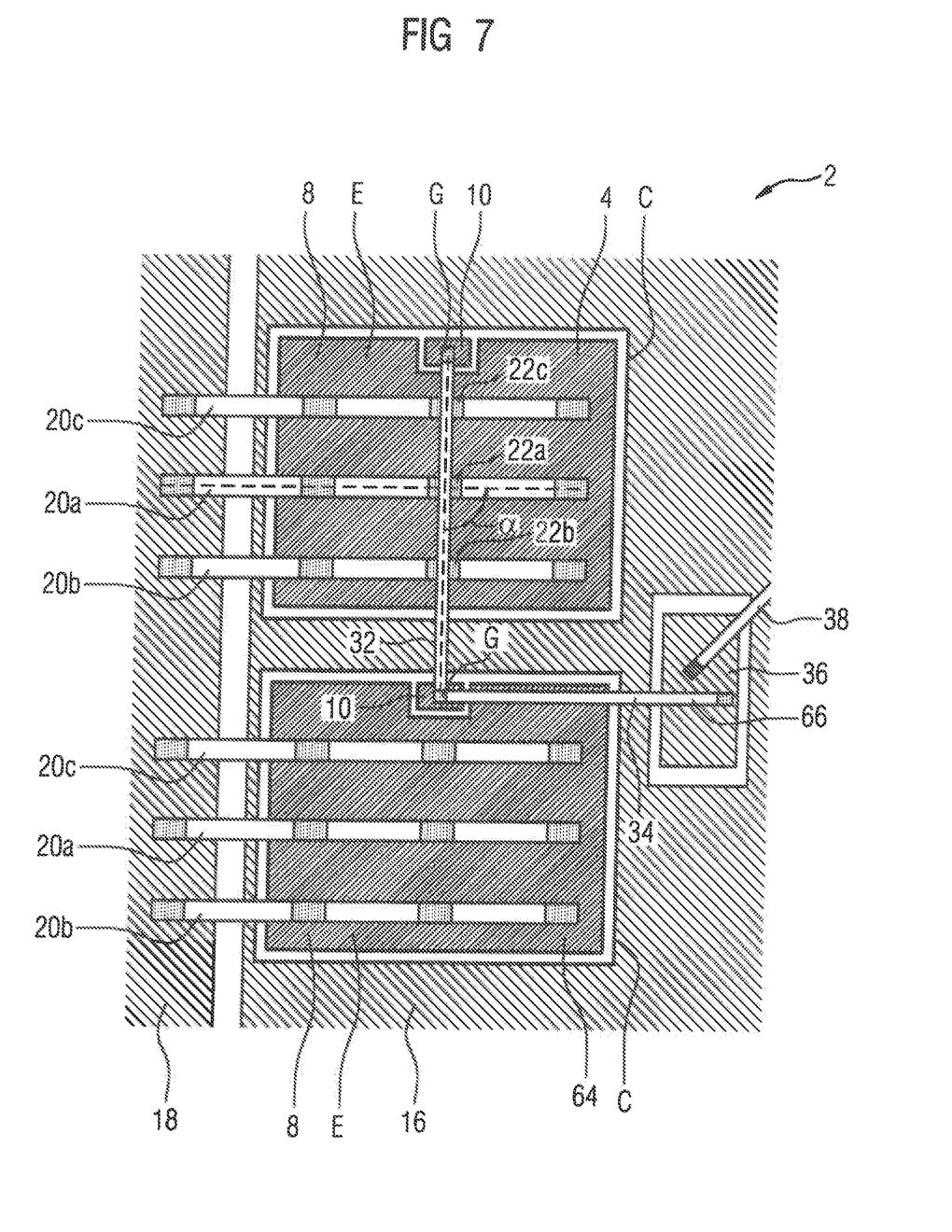
FIG. 7 shows a schematic representation of a fourth embodiment of a semiconductor arrangement in a plan view.

FIG. 7 shows a schematic representation of a fourth embodiment of a semiconductor arrangement in a plan view, with the semiconductor element 4 and a further semiconductor element 64 being connected in parallel. The semiconductor elements 4, 64, which are designed, by way of example, as IGBTs. The contact surfaces 8 of the emitter terminals E of the semiconductor elements 4, 64 connected in parallel are connected to the second conductor path 18, by way of example, via three first bond connecting means 20a, 20b, 20c respectively, which are arranged to run substantially parallel. In addition, on a side remote from the substrate 6, the semiconductor elements 4, 64 have a control contact surface 10 of a gate terminal G respectively. The first transverse loop 32 of the second bond connecting means 34 establishes a connection of the control contact surface 10 of the further semiconductor element 64 to the control contact surface 10 of the semiconductor element 4. A further loop 66 of the second bond connecting means 34 connects the control contact surface 10 of the further semiconductor element 64 to the third conductor path 36, with the third conductor path 36 being connected, as shown in FIG. 1, to an actuation apparatus, by way of example via the further bond connecting means 38. The second bond connecting means 34 thus connects the gate terminals G of the semiconductor elements 4, 64 to the third conductor path 36 by means of multi-stitch wedge-to-wedge wire bonding. The further design of the semiconductor arrangement 2 in FIG. 7 corresponds to that in FIG. 1.

Figure 8:
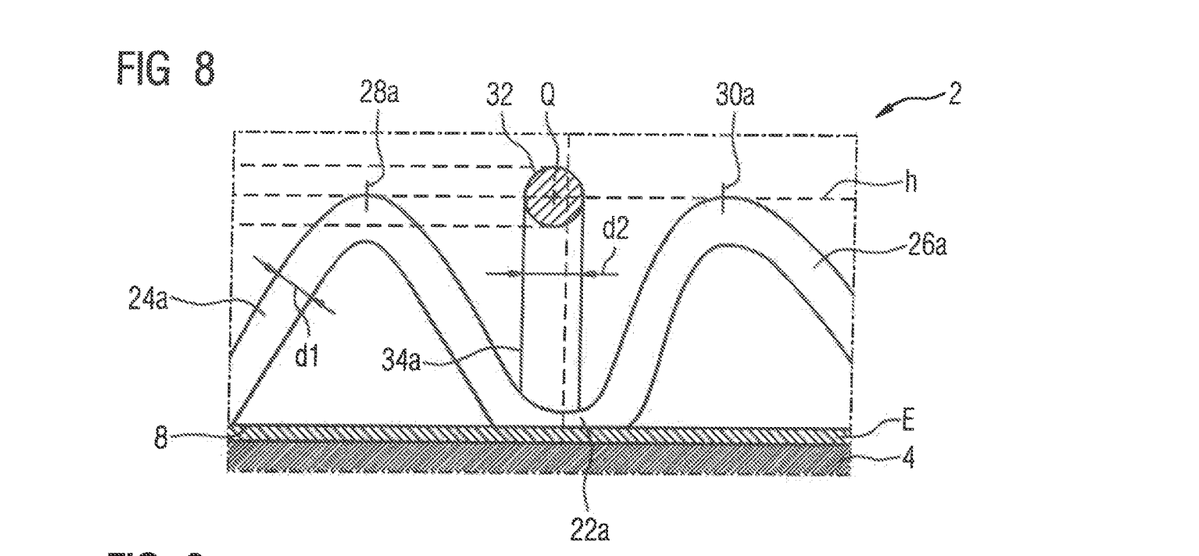
FIG. 8 shows an enlarged schematic representation of a fifth embodiment of a semiconductor arrangement in a cross-section.

FIG. 8 shows an enlarged schematic representation of a fifth embodiment of a semiconductor arrangement 2 in a cross-section, with a first transverse loop 32 of a second bond connecting means 34 being shown in the region of a semiconductor element 4. On the contact surface 8, a first bond connecting means 20a forms a first stitch contact 22a, which is arranged between a first loop 24a and a second loop 26a of the first bond connecting means 20a. The second bond connecting means 34 has a substantially circular cross-sectional area Q with a diameter d2, which is smaller than the diameter d1 of the cross-sectional area of the first bond connecting means 20a.

The first loop 24a has a first maximum 28a while the second loop 26a has a second maximum 30a. By way of example, the first maximum 28a and the second maximum 30a have the same height h. The height should be taken to mean, for example, a spacing of the maxima 28a, 30a from the substrate 6. The first transverse loop 32 of the second bond connecting means 34 is arranged above the first stitch contact 22a and between the first maximum 28a of the first loop 24a and the second maximum 30a of the second loop 26a. In addition, the first transverse loop 32 of the second bond connecting means 34 is arranged to run below the first maximum 28a of the first loop 24a and the second maximum 30a of the second loop 26a, with at least part of the cross-sectional area Q of the second bond connecting means 34 running below the first maximum 28a of the first loop 24a and the second maximum 30a of the second loop 26a when crossing the first bond connecting means 20a. The further design of the semiconductor arrangement 2 in FIG. 8 corresponds to that in FIG. 1.

Figure 9:
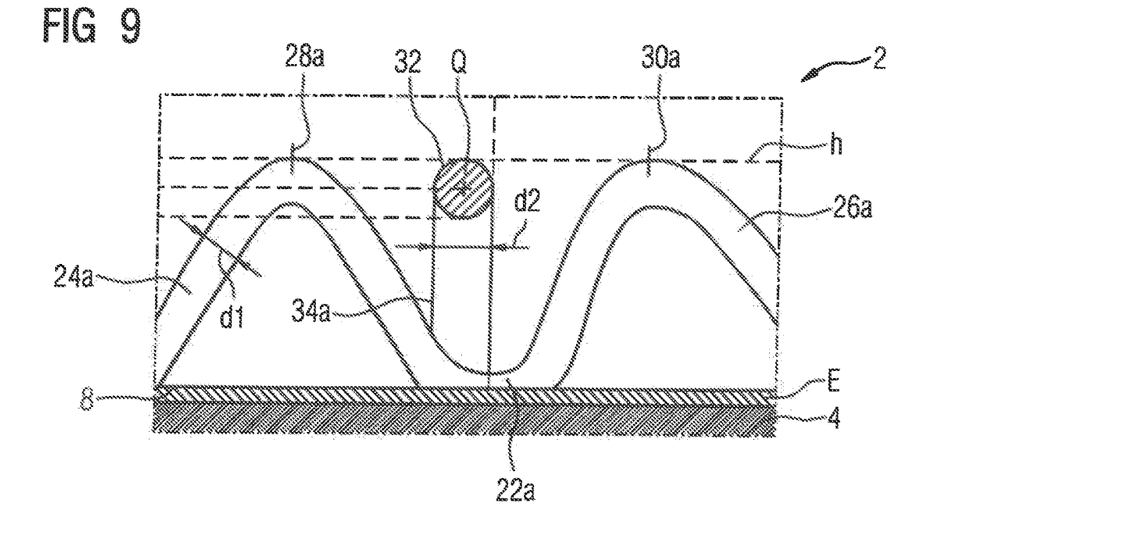
FIG. 9 shows an enlarged schematic representation of a sixth embodiment of a semiconductor arrangement in a cross-section.

FIG. 9 shows an enlarged schematic representation of a sixth embodiment of a semiconductor arrangement 2 in a cross-section. The first transverse loop 32 of the second bond connecting means 34 is arranged to run completely below the first maximum 28a of the first loop 24a and the second maximum 30a of the second loop 26a, with the entire cross-sectional area Q of the second bond connecting means 34 running below the first maximum 28a of the first loop 24a and the second maximum 30a of the second loop 26a when crossing the first bond connecting means 20a. The further design of the semiconductor arrangement 2 in FIG. 9 corresponds to that in FIG. 8.

Figure 10:
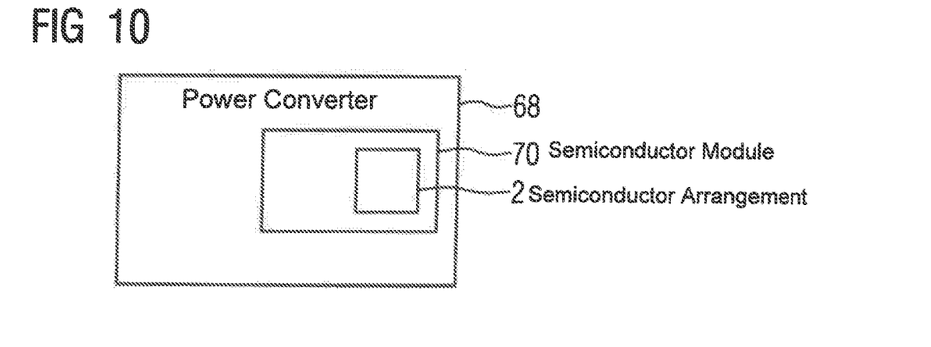
FIG. 10 shows a schematic representation of a power converter.

FIG. 10 shows a schematic representation of a power converter 68, which comprises, by way of example, a semiconductor module 70. The semiconductor module 70 has, by way of example, a semiconductor arrangement 2.

To summarize, the invention relates to a semiconductor arrangement 2 with a semiconductor element 4, a substrate 6 and bond connecting means 20a, 20b, 20c, 34, 58. To achieve improved wiring, compared to the prior art, it is proposed that the semiconductor element 4 is connected, in particular integrally bonded, to the substrate 6, wherein on a side remote from the substrate 6, the semiconductor element 4 has at least one contact surface 8, wherein at least one contact surface 8 of the semiconductor element 4 is connected to the substrate 6 via at least one first bond connecting means 20a, 20b, 20c, wherein on the contact surface 8, the at least one first bond connecting means 20a, 20b, 20c forms at least one first stitch contact 22a, 22b, 22c, which is arranged between a first loop 24a, 24b, 24c and a second loop 26a, 26b, 26c of the at least one first bond connecting means 20a, 20b, 20c, wherein the first loop 24a, 24b, 24c has a first maximum 28a, 28b, 28c and the second loop 26a, 26b, 26c has a second maximum 30a, 30b, 30c, wherein a first transverse loop 32 of a second bond connecting means 34 is arranged to run above the first stitch contact 22a, 22b, 22c and between the first maximum 28a, 28b, 28c of the first loop 24a, 24b, 24c and the second maximum 30a, 30b, 30c of the second loop 26a, 26b, 26c.

What is claimed:

1. A semiconductor arrangement, comprising:
a substrate;
a semiconductor element connected to the substrate and comprising on a side remote from the substrate a contact surface; and
bond connecting means, with the contact surface of the semiconductor element being connected to the substrate via a first one of the bond connecting means such that the first one of the bond connecting means forms on the contact surface a stitch contact arranged between a first loop and a second loop of the first one of the bond connecting means, with the first loop having a first maximum and the second loop having a second maximum,
wherein a second one of the bond connecting means has a first transverse loop arranged to run above the first stitch contact and, viewed running parallel to the contact surface, between the first maximum of the first loop and the second maximum of the second loop, the first transverse loop of the second one of the bond connecting means being arranged to run below the first maximum of the first loop and/or the second maximum of the second loop.

2. The semiconductor arrangement of claim 1, wherein the semiconductor element is integrally bonded to the substrate.

3. The semiconductor arrangement of claim 1, wherein the first transverse loop of the second one of the bond connecting means runs completely below the first maximum of the first loop and/or the second maximum of the second loop.

4. The semiconductor arrangement of claim 1, wherein the first transverse loop of the second one of the bond connecting means is partially enclosed by the second loop of the first one of the bond connecting means.

5. The semiconductor arrangement of claim 1, wherein on the side remote from the substrate, the semiconductor element comprises a control contact surface, with the second one of the bond connecting means being connected to the control contact surface.

6. The semiconductor arrangement of claim 1, further comprising a further semiconductor element including a control contact surface which is connected to the contact surface of the semiconductor element via the first transverse loop of the second one of the bond connecting means.

7. The semiconductor arrangement of claim 1, wherein the second one of the bond connecting means is arranged at an angle between 75° and 90° to the first one of the bond connecting means.

8. The semiconductor arrangement of claim 1, wherein the second one of the bond connecting means is arranged at an angle between 85° and 90° to the first one of the bond connecting means.

9. The semiconductor arrangement of claim 1, wherein the first one of the bond connecting means forms on the contact surface a second stitch contact, which is arranged between the first loop and a third loop of the first one of the bond connecting means, with the third loop having a third maximum, the semiconductor arrangement further comprising a third one of the bond connecting means having a second transverse loop arranged to run above the second stitch contact and, viewed running parallel to the contact surface, between the first maximum of the first loop and the third maximum of the third loop.

10. The semiconductor arrangement of claim 9, wherein the first transverse loop of the second one of the bond connecting means and the second transverse loop of the third one of the bond connecting means are arranged to run below the first maximum of the first loop, the second maximum of the second loop and/or of the third maximum of the third loop.

11. The semiconductor arrangement of claim 9, wherein the first transverse loop of the second one of the bond connecting means and the second transverse loop of the third one of the bond connecting means are arranged to run completely below the first maximum of the first loop, the second maximum of the second loop and/or of the third maximum of the third loop.

12. The semiconductor arrangement of claim 1, further comprising a plurality of said first one of bond connecting means arranged to run in parallel relationship, with the first stitch contacts of each of the plurality of said first one of bond connecting means running between the first loop and the second loop, with the first transverse loop of the second one of the bond connecting means arranged to run above the first stitch contact and, viewed running parallel to the contact surface, between the first maximum of the first loop and the second maximum of the second loop.

13. The semiconductor arrangement of claim 12, wherein the first transverse loop of the second one of the bond connecting means is arranged to run, in particular completely, below the first maximum of the first loop and/or the second maximum of the second loop.

14. The semiconductor arrangement of claim 12, wherein the first transverse loop of the second one of the bond connecting means is arranged to run completely below the first maximum of the first loop and/or the second maximum of the second loop.

15. A semiconductor module, comprising a semiconductor arrangement, said semiconductor arrangement comprising a substrate, a semiconductor element connected, in particular integrally bonded, to the substrate and comprising on a side remote from the substrate a contact surface, and bond connecting means, with the contact surface of the semiconductor element being connected to the substrate via a first one of the bond connecting means such that the first one of the bond connecting means forms on the contact surface a stitch contact arranged between a first loop and a second loop of the first one of the bond connecting means, with the first loop having a first maximum and the second loop having a second maximum, wherein a second one of the bond connecting means has a first transverse arranged to run above the first stitch contact and, viewed running parallel to the contact surface, between the first maximum of the first loop and the second maximum of the second loop, the first transverse loop of the second one of the bond connecting means being arranged to run, in particular completely, below the first maximum of the first loop and/or the second maximum of the second loop.

16. A power converter, comprising a semiconductor module as set forth In claim 15.

17. A method for producing a semiconductor arrangement, the method comprising:
connecting a semiconductor element to a substrate, in particular through Integrally bonding, such that a contact surface on a substrate-remote side of the semiconductor element Is connected to the substrate via a first bond connecting means;
forming the first bond connecting means on the contact surface with a stitch contact arranged between a first loop and a second loop of the first bond connecting means, with the first loop having a first maximum and the second loop having a second maximum;
arranging a first transverse loop of a second bond connecting means to run above the first stitch contact and, viewed parallel to the contact surface, between the first maximum of the first loop and the second maximum of the second loop; and
arranging the first transverse loop of the second bond connecting means to run, in particular completely, below the first maximum of the first loop and/or the second maximum of the second loop.

18. The method of claim 17, further comprising partially enclosing the first transverse loop of the second bond connecting means by the second loop.

19. The method of claim 17, further comprising arranging the second bond connecting means at an angle of more than 75°, In particular 85°, to the first bond connecting means.

20. The method of claim 17, further comprising:
forming the first bond connecting means on the contact surface with a second stitch contact; and
arranging the second stitch contact between the second loop and a third loop of the first bond connecting means, with the third loop having a third maximum; and
arranging a second transverse loop of a third bond connecting means to run above the second stitch contact and, viewed running parallel to the contact surface, between the second maximum of the second loop and the third maximum of the third loop.

* * * * *